United States Patent
Hsu

(10) Patent No.: US 7,919,339 B2
(45) Date of Patent: Apr. 5, 2011

(54) PACKAGING METHOD FOR LIGHT EMITTING DIODE MODULE THAT INCLUDES FABRICATING FRAME AROUND SUBSTRATE

(75) Inventor: Chi-Yuan Hsu, Wugu Township, Taipei County (TW)

(73) Assignees: iLEDM photoelectronics, Inc., Taipei County (TW); Chi-Yuan Hsu, Taipei County (TW)

( * ) Notice: Subject to any disclaimer, the term of this patent is extended or adjusted under 35 U.S.C. 154(b) by 256 days.

(21) Appl. No.: 12/206,523

(22) Filed: Sep. 8, 2008

(65) Prior Publication Data

US 2010/0059770 A1 Mar. 11, 2010

(51) Int. Cl.
*H01L 33/60* (2010.01)
(52) U.S. Cl. .................. 438/28; 438/29; 257/E33.059; 257/E33.061
(58) Field of Classification Search .................. 438/28
See application file for complete search history.

(56) References Cited

U.S. PATENT DOCUMENTS

| 6,869,813 | B2 * | 3/2005 | Okazaki | 438/22 |
| 2005/0087750 | A1 * | 4/2005 | Braddell et al. | 257/89 |
| 2006/0145172 | A1 * | 7/2006 | Su et al. | 257/98 |
| 2008/0042151 | A1 * | 2/2008 | Oh et al. | 257/88 |
| 2008/0203419 | A1 * | 8/2008 | Harada | 257/98 |

* cited by examiner

*Primary Examiner* — Stephen W Smoot

(57) ABSTRACT

A packaging method for light emitting diode module that includes fabricating frame around substrate, wherein the method comprises the steps of: fabricating a printed circuit layer with a plurality of staggered nodes on a substrate; fabricating a frame around the substrate; fabricating a protruding inclined pier around the bottom rim of the inner wall of the frame; fabricating a plurality of convex reflecting microstructure points on the surface of the printed circuit layer; positioning chips and wire bonding; spraying reflecting paint on the surface of the substrate and the inner wall of the frame except the chips; filling a silica gel diffusion layer formed by mixing the silica gel and the diffusion powder into the frame; and evenly coating a fluorescent glue layer formed by evenly mixing another silica gel and fluorescent powder on the silica gel diffusion layer.

7 Claims, 10 Drawing Sheets

PACKAGING METHOD FOR LIGHT EMITTING DIODE MODULE THAT INCLUDES FABRICATING FRAME AROUND SUBSTRATE

BACKGROUND OF THE INVENTION

1. Field of the Invention

The present invention relates to a light emitting diode, and more particularly to a packaging method for light emitting diode module that includes fabricating frame around substrate, which can not only improve the luminous efficiency, but also lower the temperature and reduce the useless light.

2. Description of the Prior Art

Conventional lighting fixtures have a lot of disadvantages, for example, the incandescent lamp is cheap, but it has the following disadvantages: low luminous efficiency, energy wasting, short service life, frangible, etc. The fluorescent lamps quite save energy, but it has the disadvantages, such as mercury pollution, frangible, etc. Comparatively speaking, the light emitting diode (LED) and the cold light source that satisfy the Energy Conservation and Environmental Protection and Safety standards of every country have the following advantages: long service life, energy-saving, pure emission color, high anti-vibration, safety, no pollution, compact, etc.

Although the light emitting diode has the above advantages, the lamp products of the light emitting diode still has many problems to be solved due to the limitation of the luminous efficiency. Please refer to FIGS. 1-2, a conventional LED chip structure comprises a substrate 10 on which a plurality of light source chips 11 is regularly arranged. The light source chip 11 is bonded to the circuit via the wire 12. A frame 13 is disposed around the substrate 10, and finally, the transparent silica gel 14 is filled in the frame 13, and a fluorescent layer 15 is coated on the surface of the transparent silica gel 14. Such a conventional design has the following disadvantages:

1. The conventional products on the market all comprise a circuit substrate 10 on which a plurality of light source chips 11 is installed. Since the respective light source chips 11 emit light toward different directions, the light emitted toward the circuit substrate 10 and the frame 13 is useless, thus causing the following problems to the LED light source products, such as excessively low luminous efficiency, excessively high temperature, multiple shadows, etc. Although such a design can realize the illumination luminosity of the traditional incandescent bulbs, the disadvantages, such as: energy waste of the useless light, excessively high temperature and the superposition of the shadows cannot be neglected;

2. The transparent silica gel 14 is used on the conventional circuit substrate 10 to clad and protect the light source chips 11, but when the transparent silica gel 14 is filled, the liquid transparent silica gel 14 will cause the capillarity relative to the frame 13, so the surface of the solidified transparent silica gel 14 will be concave in the center thereof, and the fluorescent particles in the sequent coated fluorescent layer 15 will also centrally gather, thus causing the uneven luminous effect, and the uneven diffuse reflection will cause much more useless light;

3. The conventional wire 12 (gold wire), the substrate 10 and the frame 13 are all irradiated by the light of the light source chips 11, but the wire 12 will create shadow, and the concave at the joint between substrate 10 and the frame 13 will also absorb light to cause the light waste again.

The present invention has arisen to mitigate and/or obviate the afore-described disadvantages.

SUMMARY OF THE INVENTION

The primary objective of the present invention is to provide a package method for light emitting diode module that includes fabricating frame around substrate, which can produce a light emitting diode module with the advantages: even light, no double-shadow, high luminance, and high heat dissipation efficiency, energy-saving, etc.

The secondary objective of the present invention is to provide a structure for light emitting diode module that includes fabricating frame around substrate, which has the advantages: even light emission, high luminance, etc.

Another objective of the present invention is to provide a method and structure for light emitting diode module that includes fabricating frame around substrate, so as to improve the yield rate of the light emitting diodes and reduce the quantity of the defective products.

In order to achieve the above objectives, the package method for light emitting diode module that includes fabricating frame around substrate comprises the steps of:

A. Fabricating a printed circuit layer on a substrate: fabricating a plurality of staggered nodes on the printed circuit layer;

B. Fabricating a frame and a protruding inclined pier: fixing a white frame (adhesively bonding) around the substrate, disposing a protruding inclined pier around a bottom rim of an inner wall of the frame and spraying reflecting white paint on the inner wall of the frame and then roasting;

C. Fabricating convex reflecting microstructure points: fabricating a plurality of semicircular convex reflecting microstructure points on a surface of the printed circuit layer, and the respective reflecting microstructure points are correspondingly disposed between the plurality of nodes and then are fixed by roasting.

D. Positioning chips and wire bonding: fixing chips (LED chips) by roasting on the printed circuit layer, and then the chips are wire bonded;

E. Spraying paint: precisely spraying reflecting paint on the respective elements, excluding the chips;

F. Dispensing: filling a silica gel diffusion layer formed by mixing the silica gel and the diffusion powder, and then fixing by roasting; and G. Fabricating a fluorescent glue layer: covering the fluorescent glue layer on the surface of the silica gel diffusion layer after the fluorescent powder and the silica gel are evenly mixed to form the fluorescent glue layer.

Therefore, the light emitting diode in accordance with the present invention can reflect useless light and improve the luminous efficiency. Moreover, the advantages, such as: even fluorescent glue layer, less useless light and no double-shadow can further improve the efficiency of the present invention.

The step of fabricating a frame and a protruding inclined pier and the step of fabricating convex reflecting microstructure points in the above method are not limited to the order, the step of fabricating a convex reflecting microstructure points can also be performed before the step of fabricating a frame and a protruding inclined pier.

Therefore, the present invention can effectively reflect the light emitted from the chips to improve the luminous efficiency, and the arrangement of the chips can reduce mutual radiation to defeat the temperature increase (preventing deterioration), thus effectively reducing the temperature and the occurrence of the useless light.

The reflecting microstructure points fabricated on the surface of the printed circuit layer can adopt a shape with the refracting function, such as a semicircle, cone, an inclined surface block, a cylinder, or a triangular block. The respective reflecting microstructure points can also exert the function of refracting useless light.

The above light emitting diode multi-layer module package method is integrated by various techniques, if the present invention only adopts the techniques of fabricating the reflecting microstructure points and reflecting paint, the method generally comprises the steps of:

1. Fabricating a printed circuit layer on a substrate: fabricating a plurality of nodes on the printed circuit layer;
2. Fabricating convex reflecting microstructure points: fabricating a plurality of semicircular convex reflecting microstructure points on the surface of the printed circuit layer, correspondingly disposing the respective reflecting microstructure points between the plurality of nodes, and then roasting and fixing;
3. Positioning chips and wire bonding: positioning chips (LED chips) on the printed circuit layer and wire bonding (gold wire bonding), and then fixing them by roasting.
4. Spraying paint: precisely spraying the reflecting paint on the respective elements, excluding the chips; and
5. Packaging and fixing.

The above light emitting diode multi-layer module package method is integrated by various techniques, if the present invention only adopts the techniques of fabricating reflecting microstructure points and inclined pier, the method generally comprises the steps of;

1. Fabricating a printed circuit layer on a substrate: fabricating a plurality of nodes on the printed circuit layer;
2. Fabricating convex reflecting microstructure points: fabricating a plurality of semicircular convex reflecting microstructure points on the surface of the printed circuit layer, correspondingly disposing the respective reflecting microstructure points between the plurality of nodes, and then roasting and fixing;
3. Fabricating a frame and a protruding inclined pier: positioning a white frame (adhesively bonding) around the substrate, disposing a protruding inclined pier around the bottom rim of the inner wall of the frame;
4. Positioning chips and wire bonding: positioning chips (LED chips) on the printed circuit layer and wire bonding (gold wire bonding), and then fixing them by roasting; and
5. Dispensing: packaging and fixing or fabricating a fluorescent glue layer on the surface of the resin.

The particular structure and effect of the present invention are described as follows:

A plurality of staggered nodes is fabricated on the printed circuit layer of the substrate, and a plurality of semicircular convex reflecting microstructure points is also disposed between the plurality of nodes in a staggered manner. As a result of the above design, the chips are located in a staggered manner without excessively shielding the light. The light toward each other of the chips can be refracted for reuse by the reflecting microstructure points.

The frame is positioned around the substrate and is white. Particularly, the precision spraying technique is used to precisely spray the reflecting paint on the surface of the respective elements, only avoiding the spraying affecting the chips.

The method for fabricating the reflecting layer of the present invention is not limited to the technique of spraying paint, and the reflecting layer of the present invention can also be fabricated by other techniques, such as sputtering reflecting metal or surface deposition of the reflecting material.

Thus, the light emitted from the respective chips of the present invention cannot be adsorbed by the gold wire, the frame and the substrate, but it is effectively reflected for reuse.

There is a protruding inclined pier around the bottom rim of the inner wall of the frame, and this protruding inclined pier can be in the form of a rectangle, triangle or geometric shapes with arc surfaces in cross section and can be formed by using the precision dispensing machine to make glue flow down to the bottom surface after the adhesion along the inner wall upper rim of the frame. The protruding inclined pier can be used to defeat the capillarity in the step of dispensing, so that the surface of the silica glue diffusion layer will not be affected by the capillarity and become concave. The sequent coated fluorescent glue layer of the present invention can be flat without the central aggregation of the fluorescent particles, thus effectively improving the even degree of the light emission of the products.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
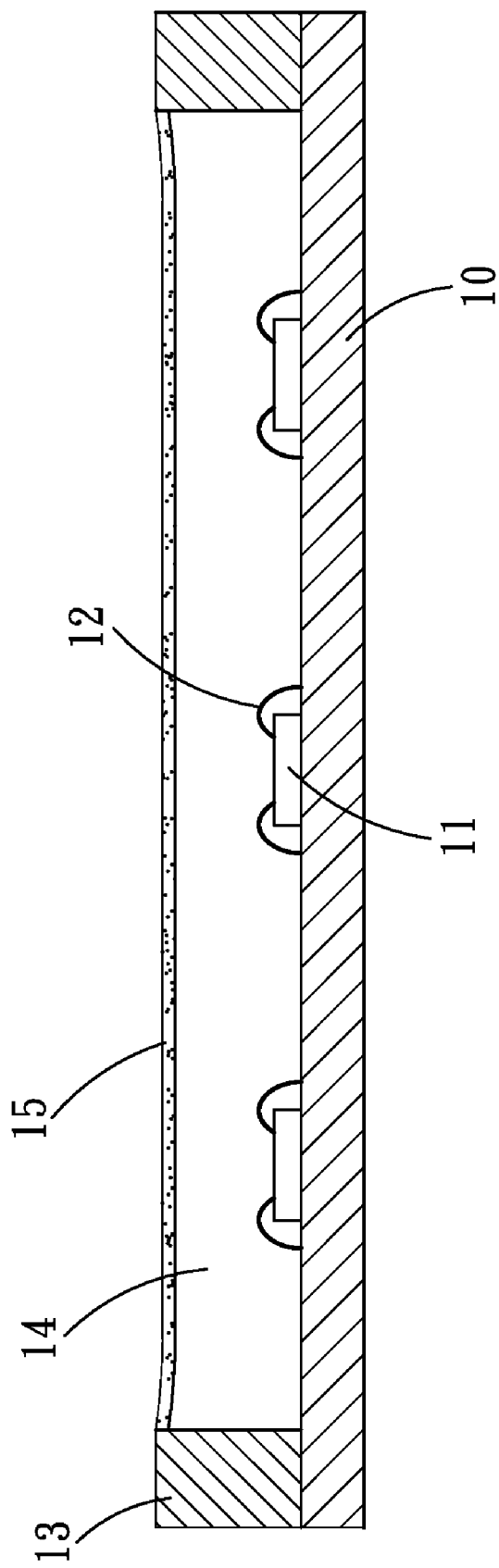
FIG. 1 is a side view of a conventional light emitting diode module structure.
Figure 2:
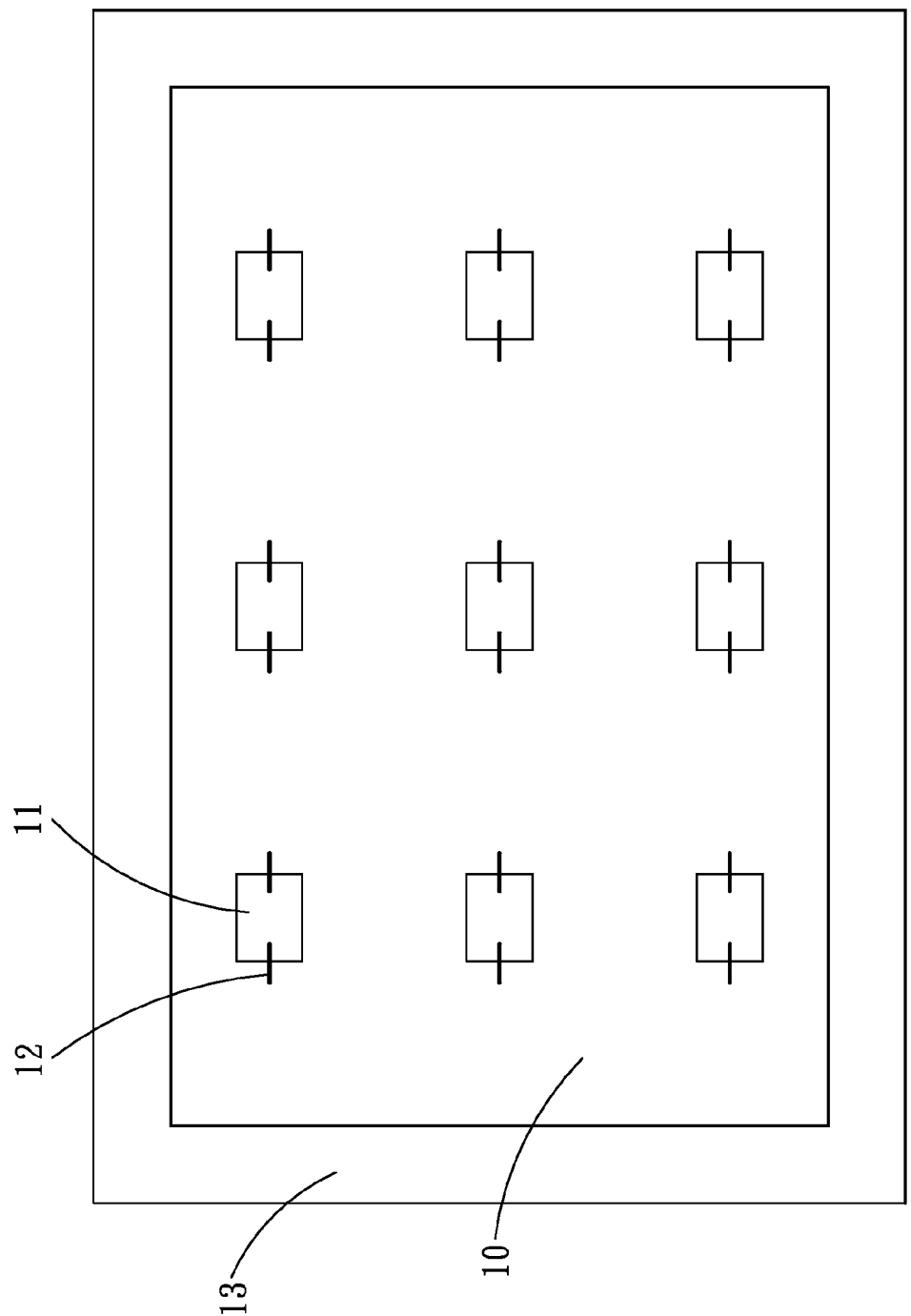
FIG. 2 is a top view of the conventional light emitting diode module structure.
Figure 3:
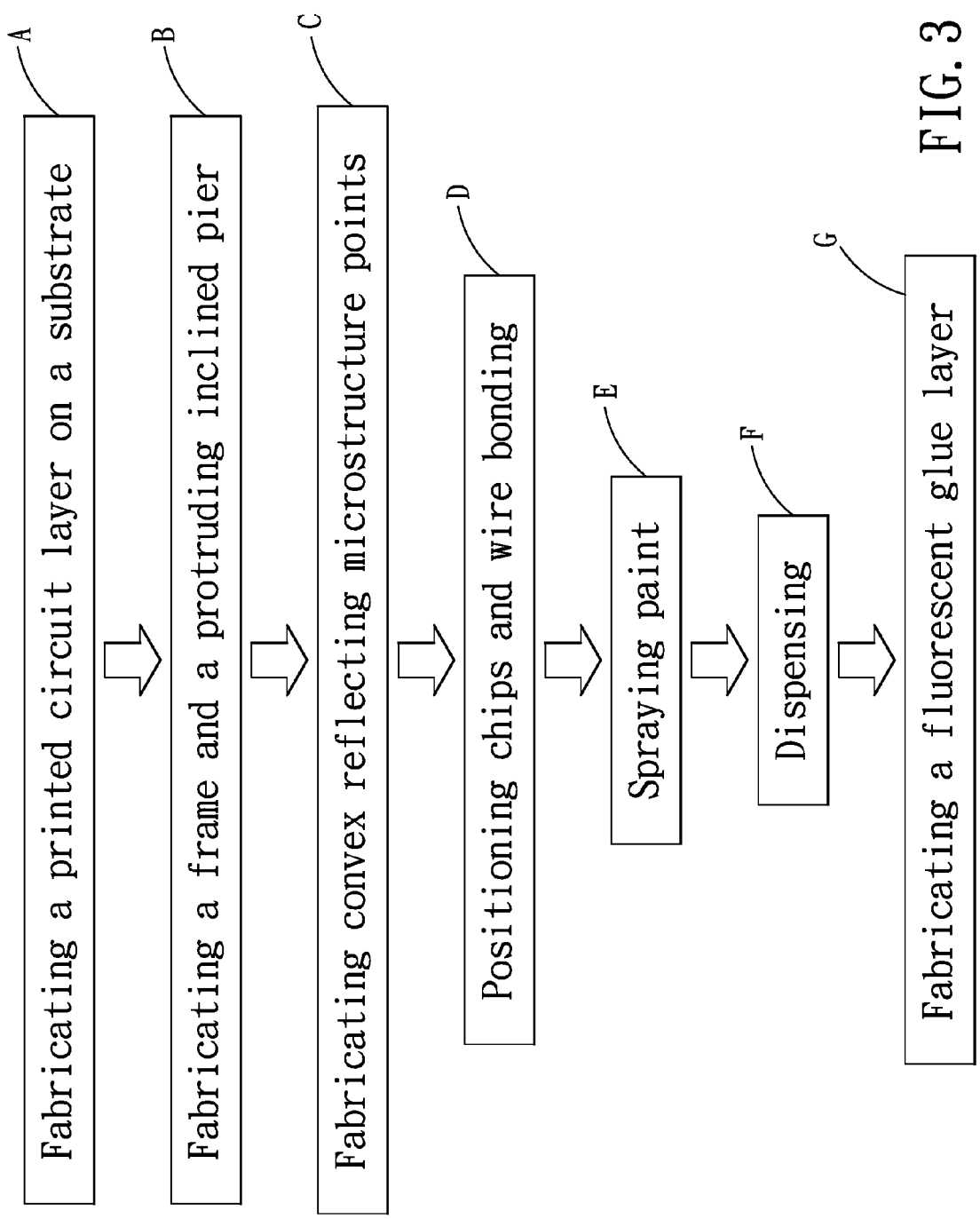
FIG. 3 is a flow chart in accordance with the present invention.
Figure 4:
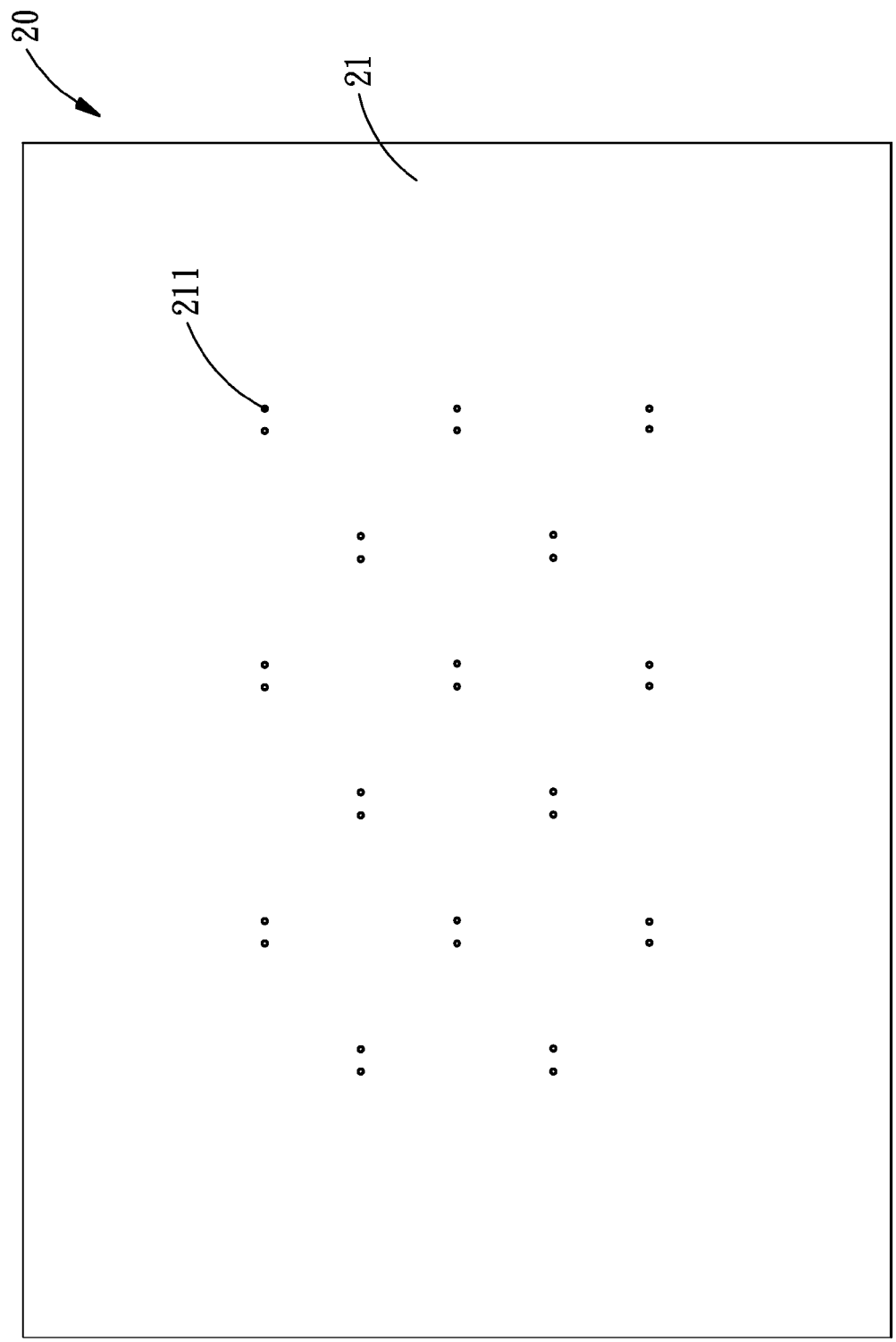
FIG. 4 is a schematic view showing the step of fabricating a printed circuit layer on a substrate in accordance with the present invention.
Figure 5:
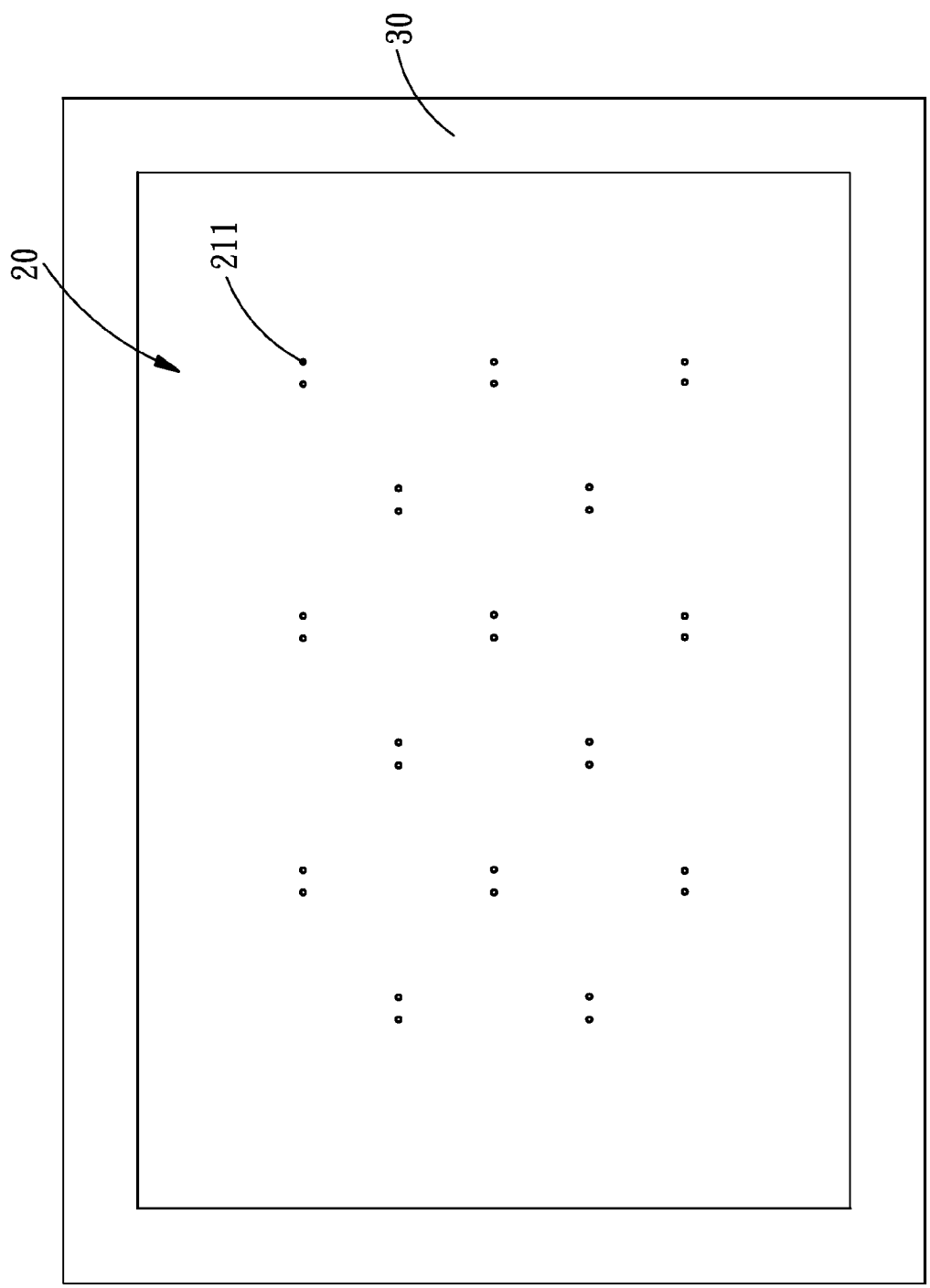
FIG. 5 is a schematic view showing the step of fabricating a frame and an inclined pier in accordance with the present invention.
Figure 7:
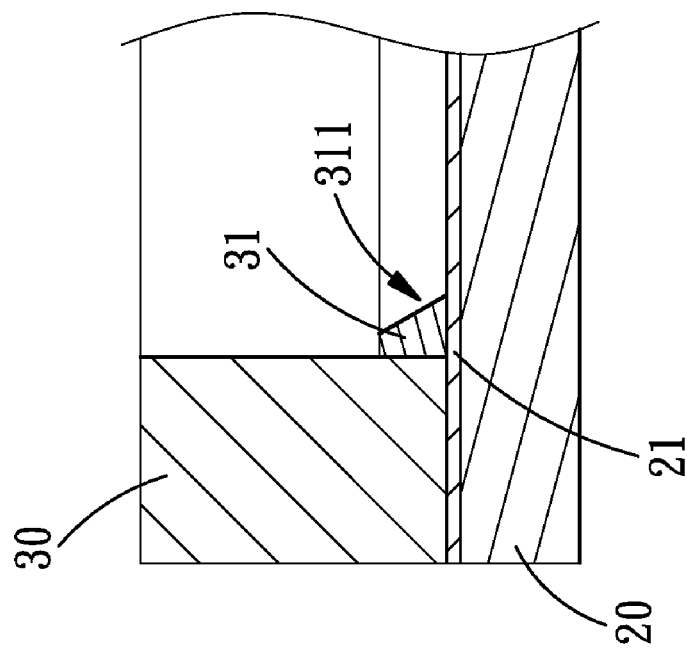
FIG. 7 is a cross sectional view of another protruding inclined pier in accordance with the present invention.
Figure 6:
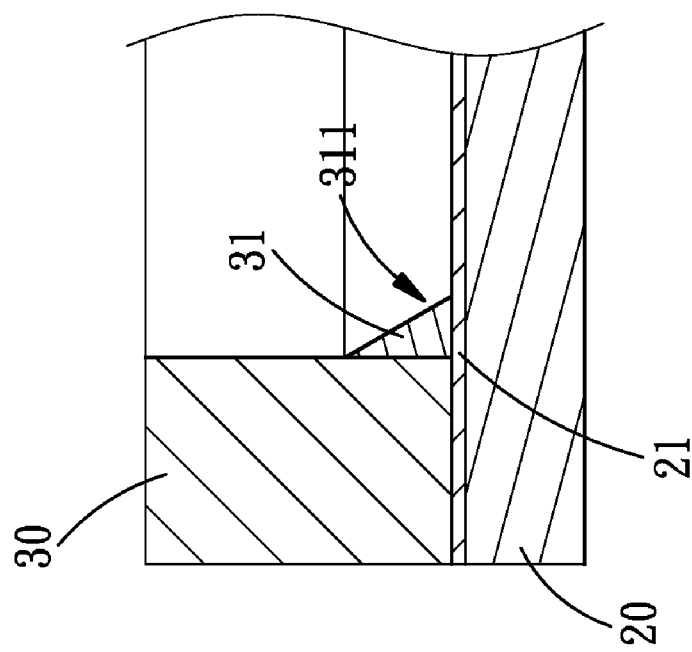
FIG. 6 is a cross sectional view of a protruding inclined pier in accordance with the present invention.
Figure 8:
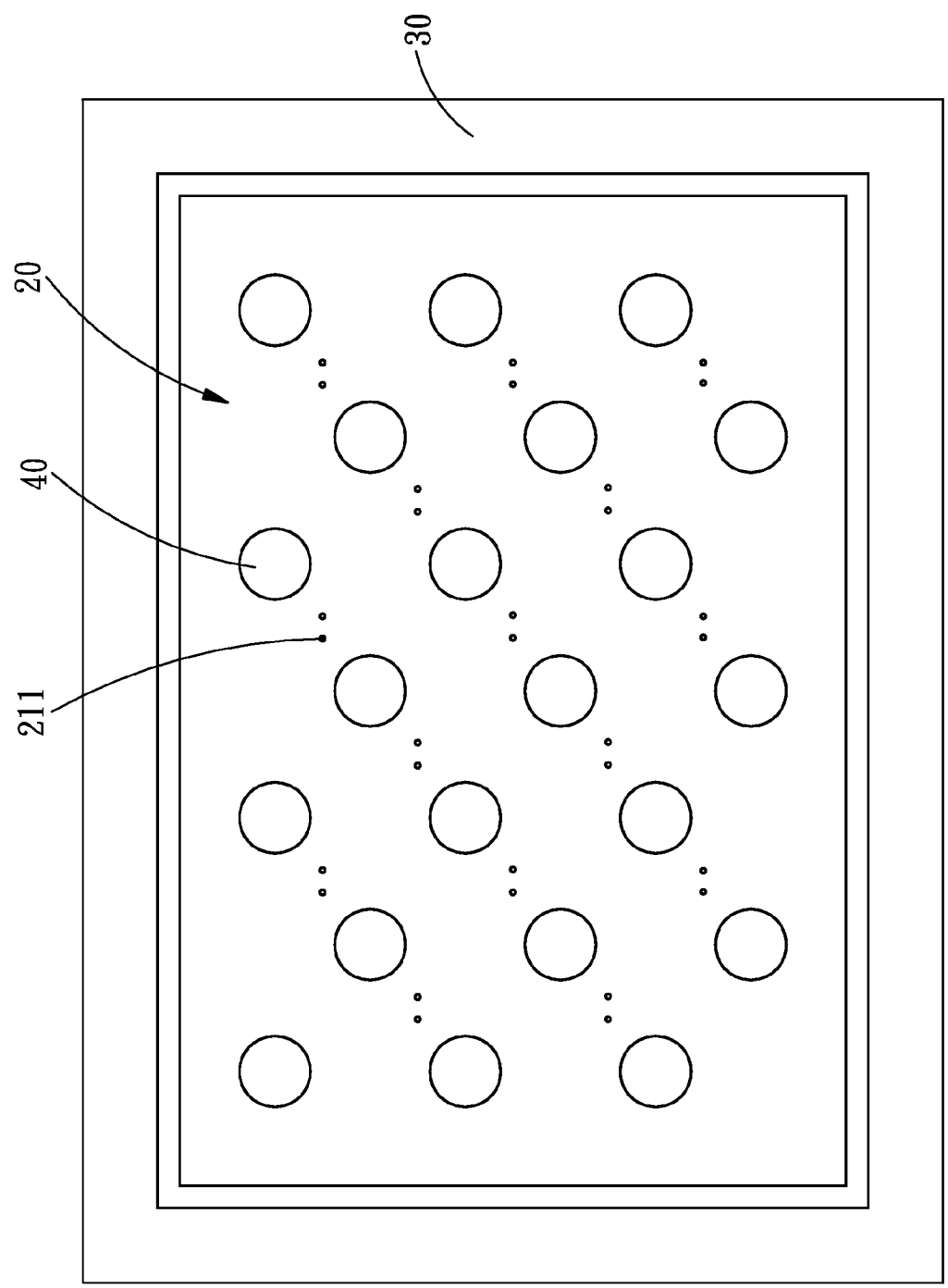
FIG. 8 is a schematic view showing the step of fabricating convex reflecting microstructure points in accordance with the present invention.
Figure 9:
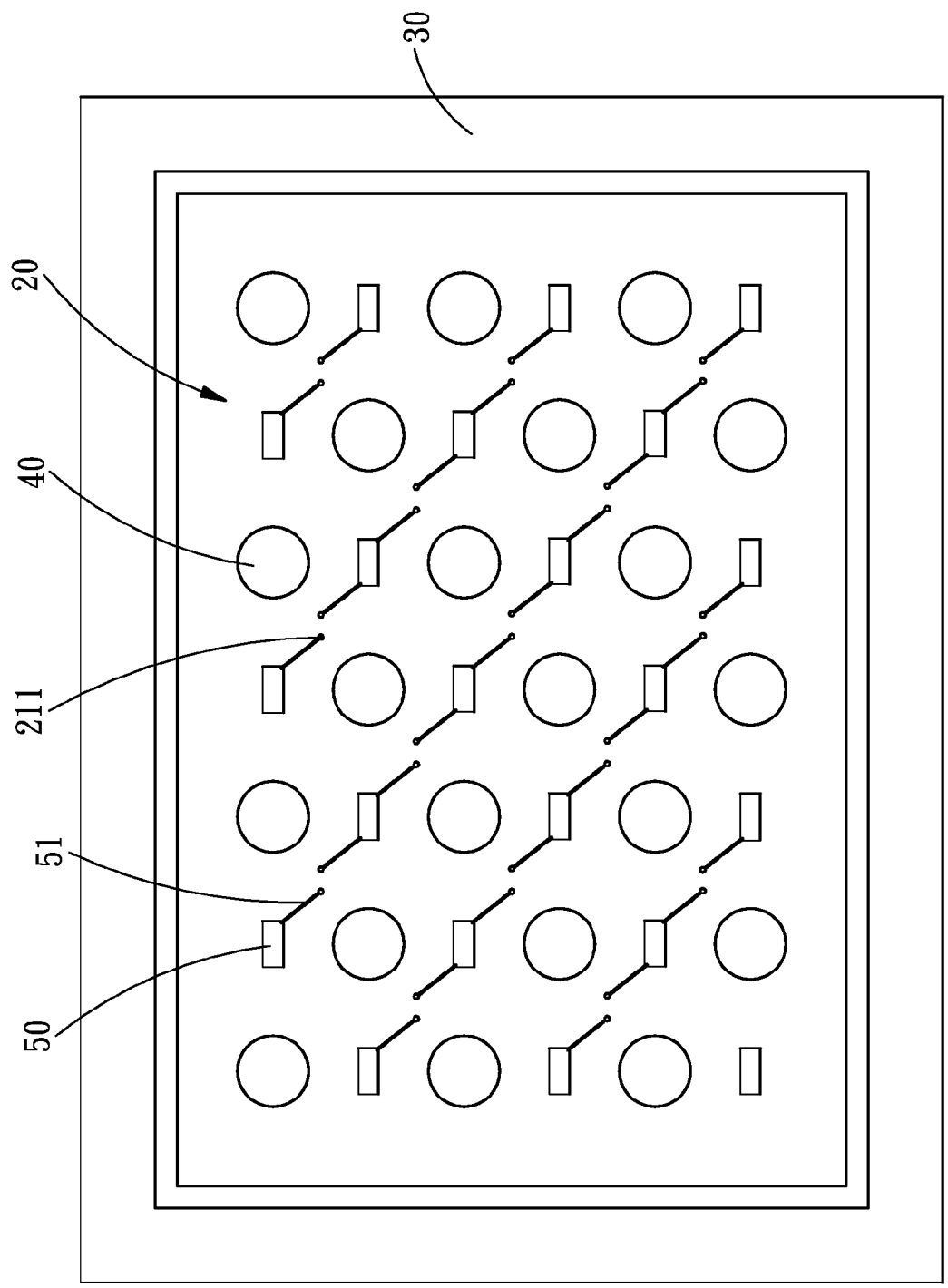
FIG. 9 is a schematic view showing the step of positioning chips and wire bonding in accordance with the present invention.
Figure 10:
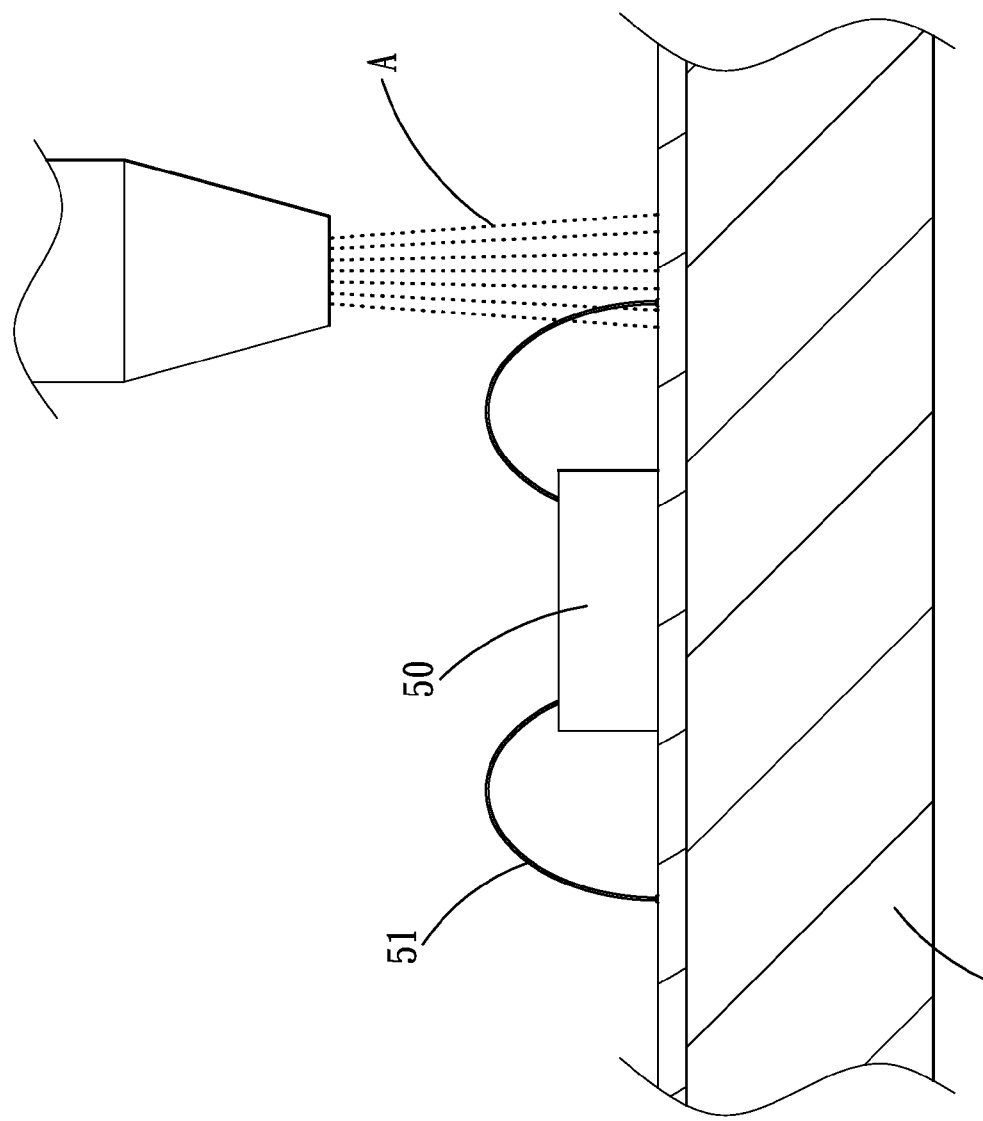
FIG. 10 is a schematic view showing the step of spraying paint in accordance with the present invention.
Figure 11:
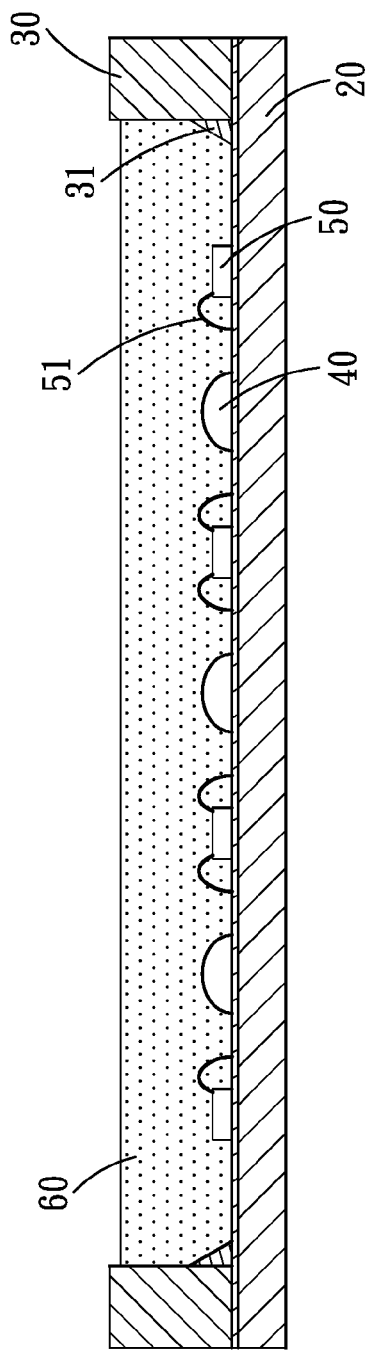
FIG. 11 is a schematic view showing the step of dispensing in accordance with the present invention.
Figure 12:
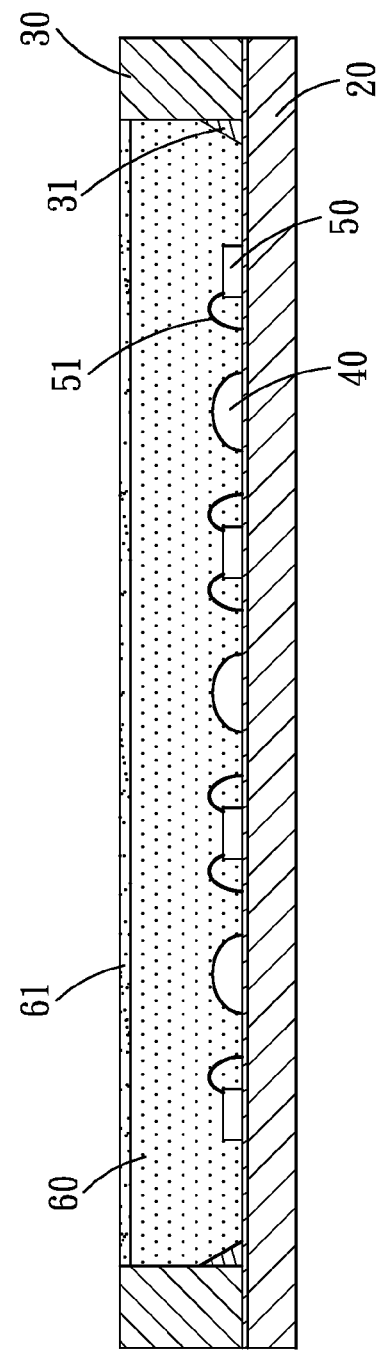
FIG. 12 is a schematic view showing the step of fabricating a fluorescent glue layer in accordance with the present invention.

Referring to FIGS. 3-12, a package method for light emitting diode module that includes fabricating frame around substrate comprises the steps of:

1. Fabricating a printed circuit layer on a substrate: fabricating a printed circuit layer 21 on a substrate 20 first, and fabricating a plurality of staggered nodes 211 on the printed circuit layer 21;
2. Fabricating a frame and a protruding inclined pier: fixing a protruding white frame 30 around the substrate 20, the white frame 30 is glued to the substrate 20, and a precision dispensing machine is used to enable the glue to flow down to the bottom surface after the adhesion along the inner wall upper rim of the frame 30, thus forming a protruding inclined pier 31 surrounding the inner wall bottom rim of the frame 30, the protruding inclined pier 31 includes an outward-spreading inclined surface 311 (FIG. 6 shows a protruding inclined pier 31 with a triangular cross section; and FIG. 7 shows a protruding inclined pier 31 with a rectangular cross section);

3. Fabricating convex reflecting microstructure points: fabricating a plurality of semicircular convex reflecting microstructure points 40 on the surface of the printed circuit layer 21, the respective reflecting microstructure points 40 are correspondingly disposed between the plurality of nodes 211 on the surface of the printed circuit layer 21, after that, the convex reflecting microstructure points 40 are fixed by roasting;

4. Positioning chips and wire bonding: positioning the LED chips 50 on the printed circuit layer 21, and then using the wire bonding machine to bond the wire on the printed circuit layer 21, and finally fixing them by roasting;

5. Spraying paint: precisely spraying a reflective paint A on the surface of the above respective elements (substrate 20, wire 51, node 211), and utilizing a precision spraying machine to ensure the chip 50 not to be sprayed;

6. Dispensing: filling a silica gel diffusion layer formed by mixing the silica gel and the diffusion powder into the frame around the substrate 20 (customarily called dispensing), enabling the silica gel diffusion layer 60 to cover or be flush with the protruding inclined pier 31, utilizing the spreading inclined surface 311 of the protruding inclined pier 31 to lower the capillarity of the silica diffusion layer 60, and carrying out the fixing operation by roasting under the plainness condition; and 7. Fabricating a fluorescent glue layer: coating an even fluorescent glue layer 61 on the surface of the silica gel diffusion layer 60 after mixing the fluorescent powder and the silica gel evenly to form the fluorescent glue layer 61.

Therefore, the LED products in accordance with the present invention can substantially reflect the useless light between the chips 50, thus improving the luminous efficiency, and the above fluorescent glue layer 61 is flat without particle aggregation, thus greatly improving the even degree of the light output.

The above package method for the LED multi-layer module is integrated by various techniques, if the present invention only adopts the technique of fabricating the convex reflecting microstructure points and the technique of the reflecting paint, the method in accordance with the present invention comprises the steps of: (this method just omits some steps, so no additional drawings are provided for explanation herein)

6. Fabricating a printed circuit layer on a substrate;
7. Fabricating convex reflecting microstructure points;
8. Positioning chips and wire bonding;
9. Spraying paint; and
10. Packaging and fixing: a common packaging and fixing method.

The above package method for a LED multi-layer module is integrated by various techniques, if the present invention only adopts the techniques of fabricating the convex reflecting microstructure points and fabricating the inclined pier, the method in accordance with the present invention comprises the steps of: (this method just omits some steps, so no additional drawings are provided for explanation herein)

7. Fabricating a printed circuit layer on a substrate;
8. Fabricating convex reflecting microstructure points;
9. Fabricating a frame and a protruding inclined pier;
10. Positioning chips and wire bonding;
11. Dispensing; and
12. Fabricating a fluorescent glue layer.

The convex reflecting microstructure points 40 in accordance with the present invention are disposed between the chips 50, and then by cooperating with the convex reflecting microstructure points 40, the light toward each other of the chips 50 is refracted for reuse, thus reducing the rate of the useless light, and improving the utilization rate of the light of the chips 50.

In order to enhance the effect of the above convex reflecting microstructure points 40 refracting the useless light, the present invention further provides the following particular structure design. The following technology not only can cooperate with the convex reflecting structure points 40 by itself, but also can be integrated into the same product:

1. On the printed circuit layer 21 of the substrate 20 is fabricated a plurality of staggered nodes 211, the chips 50 are also disposed in a staggered manner after being positioned by use of the above design, and the respective chips 50, wires 51 don't overlap with each other to excessively shield light and the convex reflecting microstructure points 40 are also located between the plurality of nodes 211 in a staggered manner.

Hence, the present invention can ensure the light of the present embodiment in accordance with the present invention to be substantially refracted for reuse.

2. When the substrate 20 is fabricated with the frame 30, the frame 30 is positioned around the substrate 20, and the frame 30 can be white (total reflection color), the precision spraying technique is used to spray the reflecting paint A on the printed circuit layer 21, the wire 51, the joint and the convex reflecting microstructure points 40, only preventing the spraying from affecting the chips 50.

Hence, the light outputted from the respective chips 50 of the present invention will not be absorbed by the printed circuit layer 21, the wire 51, the joints and the convex reflecting microstructure points 40, but will be effectively reflected by the reflecting paint A (For example, white paint) again.

3. There is a protruding inclined pier 31 surrounding the inner wall bottom rim of the frame 30, and the protruding inclined pier 31 can be rectangular (as shown in FIG. 7), triangular (as shown in FIG. 6) or other geometric shapes with arc surfaces in cross section and is formed by using the precision dispensing machine to make glue flow down to the bottom surface after the adhesion along the inner wall upper rim of the frame, the protruding inclined pier 31 can defeat the peripheral capillarity of the silica glue diffusion layer 60 in the step of dispensing, so that the surface of the silica glue diffusion layer 60 will not be affected by the capillarity and become concave.

Hence, the surface of the silica gel diffusion layer 60 of the present invention is flat, and the sequent fluorescent glue layer 61 can also be flatly coated without fluorescent particle aggregation, thus effectively improving the even degree of the light refraction of the products.

Additionally, the above even fluorescent glue layer 61 can convert the color light emitted from the chips 50 into white light, and can be additionally provided with an optical lens (conventional technology, not shown) according to the design requirements.

In the above various embodiments of the present invention, the even fluorescent glue layer can be fabricated by the vacuum suction film fabrication method, the high temperature and high pressure powder pressing method, the spraying method or the coating method.

The above frame can be glued to or integrated to the substrate.

The reflecting layer of the convex reflecting microstructure points can be formed by adopting the techniques of spraying reflecting paint, sputtering reflecting metal or surface deposition of reflecting material.

In addition, the convex reflecting microstructure points can be formed at the periphery of an arbitrary light source or between two light sources, and both can refract the useless light which is in the horizontal direction. Finally, the reflecting protrusions can be in the form of a semicircle, a cone, a block, or a water drop, etc and all can exert the refraction changing under various requirements according to the design.

It is important that, another aspect in accordance with the present invention is that, the dispensing is to fill the silica gel diffusion layer 60 formed by mixing the silica gel and diffusion powder into the frame 30 around the substrate 20 (customarily called dispensing), and the step of fabricating the fluorescent glue layer is to coat the even fluorescent glue layer 61 on the surface of the silica gel diffusion layer 60 after evenly mixing the silica gel and the fluorescent powder to form the fluorescent glue layer 61.

Hence, after the silica gel diffusion layer 60 (the first layer) formed by mixing the silica gel and the diffusion powder is solidified, the fluorescent glue layer 61 (the second layer) formed by evenly mixing another silica gel and the fluorescent powder is evenly coated on the silica gel diffusion layer 60. The LED module in accordance with the present invention can apply the silica gel diffusion layer 60 to diffuse the light to make the chips shine, thus changing the point light emission into the surface light emission to make the light output surface even without causing multiple point shadows, and then the fluorescent glue layer 61 is used to convert the light into the white light to improve the luminous efficiency.

To summarize, the present invention relates to a package method and structure for light emitting diode module that includes fabricating frame around substrate. The method of the present invention comprises the steps of: equipping a printed circuit layer with staggered nodes on a substrate; fabricating a frame around the substrate; fabricating a protruding inclined pier around the bottom rim of the inner wall of the frame; fabricating a plurality of convex reflecting microstructure points on the surface of the printed circuit layer; positioning chips and wire bonding on the printed circuit layer; precisely spraying reflecting paint on the surface of the elements excluding the chips; filling a silica gel diffusion layer into the frame (dispensing); and coating an even fluorescent glue layer on the silica gel diffusion layer.

Hence, the light emitting diode in accordance with the present invention can reflect the useless light to improve the luminous efficiency, and advantages, such as: flat fluorescent glue layer flat, even light output surface, less useless light, no multiple-point shadow, etc can further improve the efficiency of the present invention.

While we have shown and described various embodiments in accordance with the present invention, it is clear to those skilled in the art that further embodiments may be made without departing from the scope of the present invention.

What is claimed is:

1. A packaging method for a light emitting diode module comprising the steps of:
   fabricating a printed circuit layer on a substrate and fabricating a plurality of staggered nodes on the printed circuit layer;
   fabricating a frame around the substrate;
   fabricating convex reflecting microstructure points, and then fixing them by roasting;
   positioning chips and wire bonding: positioning chips in a staggered manner, and then fixing them by roasting;
   dispensing: filling a silica gel diffusion layer into the frame, and then fixing it by roasting; and
   fabricating a fluorescent glue layer: evenly coating a fluorescent glue layer on a surface of the silica gel diffusion layer.

2. The packaging method for a light emitting diode module as claimed in claim 1 further comprising the step of: precisely spraying reflecting paint on the substrate, wires and the nodes, excluding the chips.

3. A packaging method for light emitting diode module that includes fabricating frame around substrate, comprising the steps of:
   fabricating a printed circuit layer on a substrate;
   fabricating a frame and a protruding inclined pier: fixing a frame around the substrate, and around a bottom rim of an inner wall of the frame is disposed a protruding inclined pier;
   fabricating reflecting microstructure points: fabricating a plurality of reflecting microstructure points on a surface of the printed circuit layer;
   positioning chips and wire bonding;
   dispensing: filling a silica gel diffusion layer into the frame; and
   fabricating a fluorescent glue layer: coating an even fluorescent glue layer on a surface of the silica gel diffusion layer.

4. The packaging method for light emitting diode module that includes fabricating frame around substrate as claimed in claim 3, wherein the respective reflecting microstructure points are correspondingly disposed between the respective chips and then are fixed by roasting in the step of fabricating reflecting microstructure points; further a fixing by roasting operation is performed after the step of positioning chips and wire bonding.

5. The packaging method for light emitting diode module that includes fabricating frame around substrate as claimed in claim 3, wherein the protruding inclined pier is formed by using a precision dispensing machine to make glue flow down after adhesion along an upper rim of the inner wall of the frame, and is used to defeat a peripheral capillarity of the silica gel diffusion layer during dispensing.

6. A packaging method for light emitting diode module that includes fabricating frame around substrate, comprising the steps of:
   fabricating a printed circuit layer on a substrate, fabricating a plurality of staggered nodes on the printed circuit layer;
   fabricating a frame and an inclined pier: fixing a frame around the substrate, and fabricating a protruding inclined pier around a bottom rim of an inner wall of the frame;
   fabricating convex reflecting microstructure points: fabricating a plurality of convex reflecting microstructure points on a surface of the printed circuit layer, and the respective convex reflecting microstructure points are correspondingly disposed between the plurality of nodes;
   positioning chips and wire bonding;
   precisely spraying reflecting paint on predetermined elements, excluding the chips;
   dispensing: filling a silica gel diffusion layer into the frame; and
   fabricating a fluorescent glue layer: coating an even fluorescent glue layer on a surface of the silica gel diffusion layer.

7. The packaging method for light emitting diode module that includes fabricating frame around substrate as claimed in claim 6, wherein the protruding inclined pier is formed by using a precision dispensing machine to make glue flow down after adhesion along an upper rim of the inner wall of the frame, and is used to defeat a peripheral capillarity of the silica gel diffusion layer during dispensing.

* * * * *